United States Patent [19]
Ollivier

[11] Patent Number: 5,653,600
[45] Date of Patent: Aug. 5, 1997

[54] CONNECTOR FOR A SUBSTRATE WITH AN ELECTRONIC CIRCUIT

[75] Inventor: Jean-Francois Ollivier, Merdrignac, France

[73] Assignee: Framatome Connectors International, Paris, France

[21] Appl. No.: 539,431

[22] Filed: Oct. 5, 1995

[30] Foreign Application Priority Data

Oct. 7, 1994 [NL] Netherlands ............................ 9401658

[51] Int. Cl.[6] .................................................. H01R 9/09
[52] U.S. Cl. .................................. 439/73; 439/71
[58] Field of Search .................................. 439/525, 526, 439/66, 21, 73

[56] References Cited

U.S. PATENT DOCUMENTS

| | | | |
|---|---|---|---|
| 4,969,826 | 11/1990 | Grabbe | 439/66 |
| 5,161,983 | 11/1992 | Ohno et al. | 439/71 |
| 5,215,472 | 6/1993 | DelPrete et al. | 439/66 X |
| 5,221,209 | 6/1993 | D'Amico | 439/66 X |
| 5,499,929 | 3/1996 | Miyazawa | 439/71 X |

FOREIGN PATENT DOCUMENTS 0 386 853 A1   9/1990   European Pat. Off. .

*Primary Examiner*—David L. Pirlot
*Assistant Examiner*—Daniel Wittels
*Attorney, Agent, or Firm*—Perman & Green

[57] ABSTRACT

A connector (1) for connecting a substrate (2) with an electronic circuit to a printed circuit board (4) comprises a housing (5) of insulating material with a zone (6) for receiving said substrate. A main surface of the substrate is provided with contact pads or the like arranged in a given grid pattern with a predetermined pitch in column and row directions and the substrate has side edges located at a predetermined location with respect to the contact pads and the printed circuit board has contact pads (3) arranged in the grid pattern. Through-holes (7) are provided in the zone in the grid pattern and contact members (8) are provided in at least a part of the through-holes. Further the connector comprises positioning means for locating the substrate with respect to the housing in such a manner that the through-holes of the housing are aligned with the contact pads of the substrate. These positioning means comprises a reference element (11) which can be positioned on the housing (5), the reference element having two reference edges (15, 16) adapted to cooperate with two side edges of the substrate (2), and a spring means (13) adapted to press the substrate with its side edges against the reference edges. The reference element and the housing are provided with cooperating coupling means (17–20) for accurately positioning the reference element with respect to the housing.

12 Claims, 4 Drawing Sheets

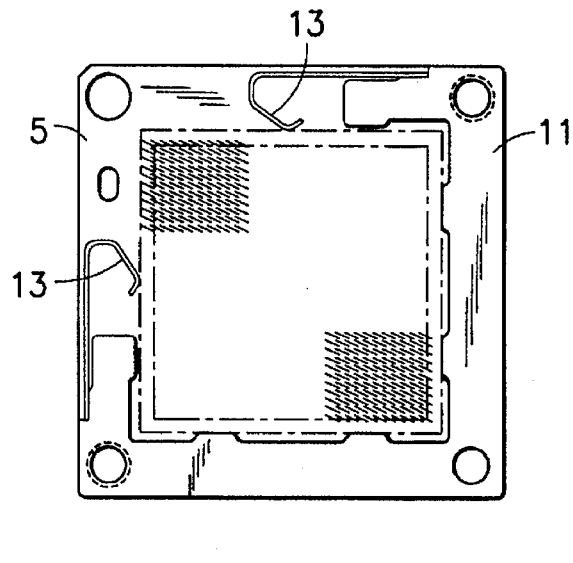
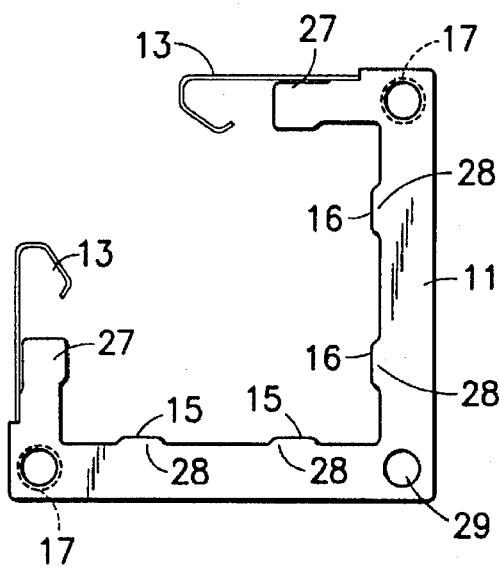
FIG. 4A            FIG. 4B
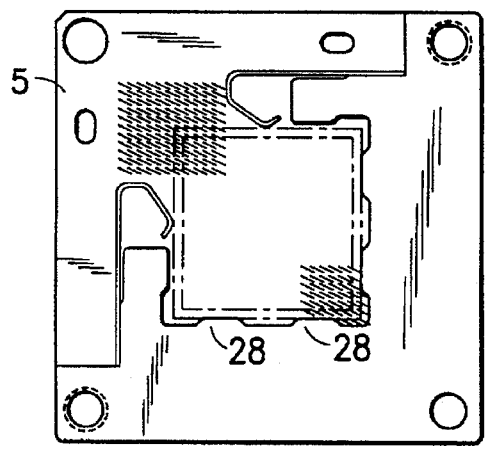
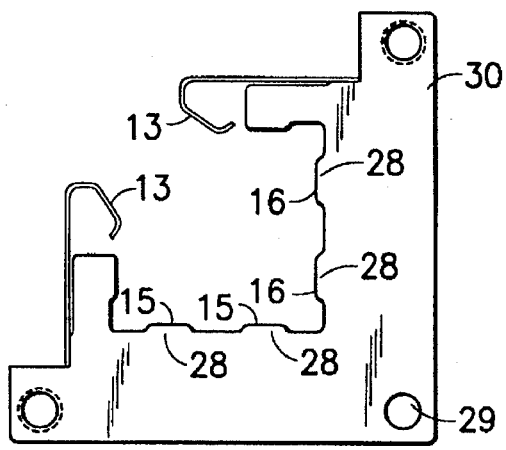
FIG. 5A            FIG. 5B

CONNECTOR FOR A SUBSTRATE WITH AN ELECTRONIC CIRCUIT

BACKGROUND OF THE INVENTION

The invention relates to a connector for connecting a substrate with an electronic circuit to a printed circuit board, wherein a main surface of the substrate is provided with contact pads or the like arranged in a given grid pattern with a predetermined pitch in column and row directions and the substrate having side edges located at a predetermined location with respect to the contact pads and said printed circuit board having contact pads arranged in said grid pattern, said connector comprising a housing of insulating material with a zone for receiving said substrate, wherein through-holes are provided in said zone in said grid pattern and contact members are provided in at least a part of said through-holes, and positioning means for locating the substrate with respect to the housing in such a manner that the through-holes of the housing are aligned with the contact pads of the substrate.

A connector of this type is described for example in U.S. Pat. No. 4,969,826 and U.S. Pat. No. 4,699,593. Such connectors are used for example for connecting the contact pads of the substrate to the contact pads of the printed circuit board. In a known substrate the contact pads are arranged in a grid pattern of 32×32. At this an accurate positioning of the substrate with respect to the housing and of the housing with respect to the printed circuit board is very important. The construction of the known connector is relatively complicated and further the connector is only suitable for a substrate of one size.

The invention aims to provide a connector of the above-mentioned type having a relatively simple construction and which is further suitable for substrates of different sizes.

SUMMARY OF THE INVENTION

In the connector according to the invention the positioning means comprises a reference element which can be positioned on the housing, said reference element having two reference edges adapted to cooperate with two side edges of the substrate, and a spring means adapted to press the substrate with said side edges against the reference edges, wherein the reference element and the housing are provided with cooperating coupling means for accurately positioning the reference element with respect to the housing.

In this manner a simple connector is obtained wherein by making the reference element as a component separate from the housing the connector can be adapted to the size of the substrate by using a different reference element.

BRIEF DESCRIPTION OF THE DRAWINGS

The invention will be further explained hereinafter by reference to the drawings in which some embodiments are shown.

FIGS. 4A and 4B show a top view of a second embodiment of the connector according to the invention and the reference element of the same, respectively.

FIGS. 5A and 5B show a top view of a third embodiment of the connector according to the invention and the reference element of the same, respectively.

DETAILED DESCRIPTION OF THE PREFERRED EMBODIMENTS

Figure 1:
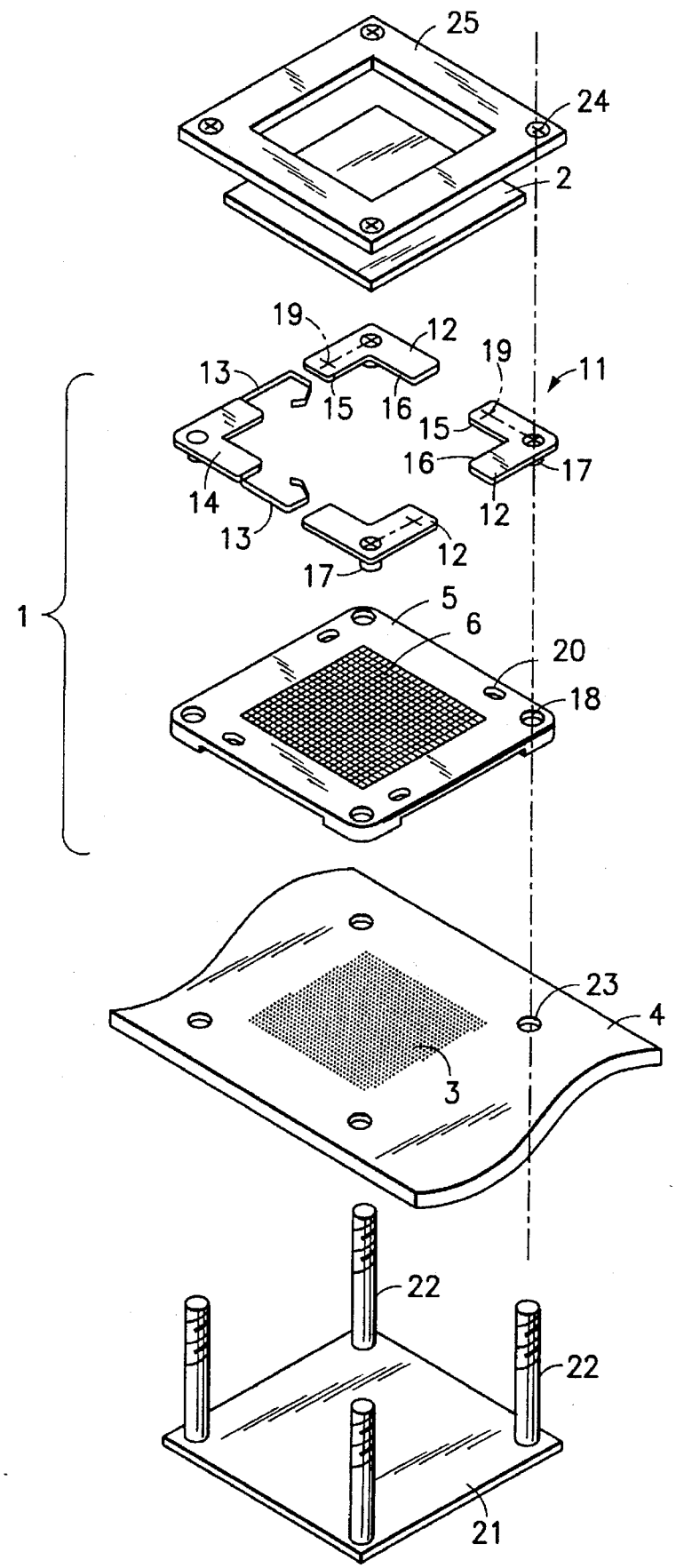
FIG. 1 shows an exploded view of a first embodiment of the connector according to the invention together with a substrate, a printed circuit board and mounting means.

FIG. 1 shows an exploded view of a connector 1 for a substrate 2, the bottom main surface of which is provided with contact pads arranged in a grid pattern which a fixed pitch in column and row directions of 1.27 mm, for example in an array of 32×32. The substrate is for example made as a so-called single chip package (SCP). The connector 1 should provide connections between the contact pads of the SCP 2 and the contact pads 3 of a printed circuit board 4 partially shown in FIG. 1. The SCP 2 can also be provided with contact balls instead of contact pads.

Figure 3:
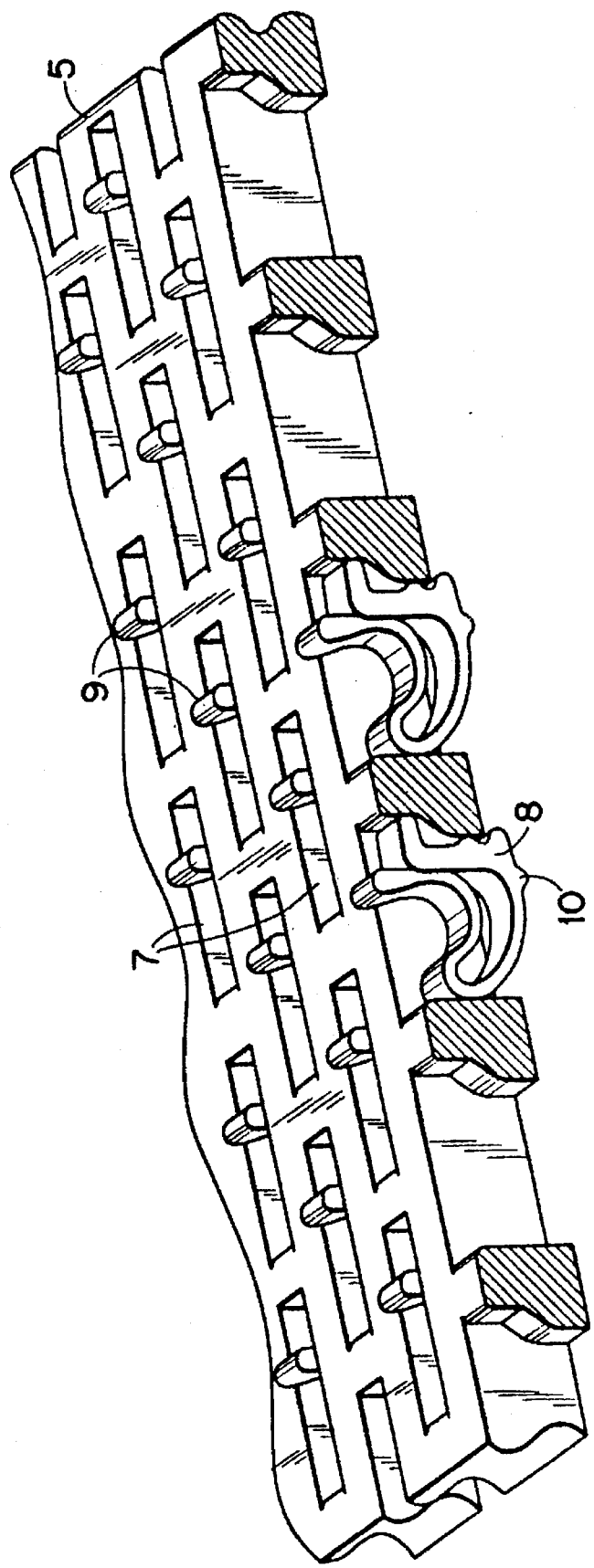
FIG. 3 partly shows a cross-section at a larger scale of the housing of the connector of FIG. 1.

To this end the connector 1 is provided with a housing 5 with a zone 6 for supporting the SCP 2. Through-holes 7 are provided in the zone 6 in the same grid pattern as the contact pads 3. As shown in FIG. 3, a contact member 8 is mounted in each hole 7, wherein a contact part 9 of the contact member 8 is adapted to contact the contact pads of the SCP 2 and a contact part 10 is adapted to contact the contact pads 3 of the printed circuit board 4.

To obtain a good connection between the contact pads of the SCP 2 and the contact parts 9 of the contact members 8 the SCP 2 should be positioned in the correct manner with respect to the holes 7. To this end the connector 1 is provided with a reference element 11 which in this embodiment comprises three mutual equal L-shaped reference sections 12, and two spring elements 13 which are mounted on a L-shaped support 14 which has substantially the same shape as the reference sections 12. Each reference section 12 has legs of equal length of which the side directed towards the zone 6 of the housing 5 forms a reference edge 15 and 16, respectively. Further each reference section 12 has a hollow pin 17 which can be fittingly received in a through-hole 18 of the housing 5. Further each reference section 12 has a projection 19 at its bottom side which is only schematically indicated and which can cooperate with a slotted hole 20 of the housing 5. By cooperation of the pin 17 and the projection 19 with the through-hole 18 and the slotted hole 20, respectively, each reference section 12 can be accurately positioned on the housing 5 in such a manner that the reference edges 15, 16 will be lying at an accurately predetermined location with respect to the through-holes 7 in the housing 5. The support 14 has only one hollow pin 17.

When the reference sections 12 and the support 14 with the spring elements 13 are mounted on the housing 5, the reference sections 12 and the support 14 indicate the location of the SCP 2 and the SCP 2 can be placed in the connector 1, wherein the spring elements 13 engage the adjacent side edges of the SCP 2 and press the opposite side edges of the SCP 2 against the reference edges 15, 16 of the diagonally opposite reference section 12. As the side edges of the SCP 2 are also lying at an accurately predetermined location with respect to the corresponding contact pads, an accurate positioning of the contact pads of the substrate 2 with respect to the holes 7 and the contact parts 9, respectively, is thereby guaranteed.

Figure 2:
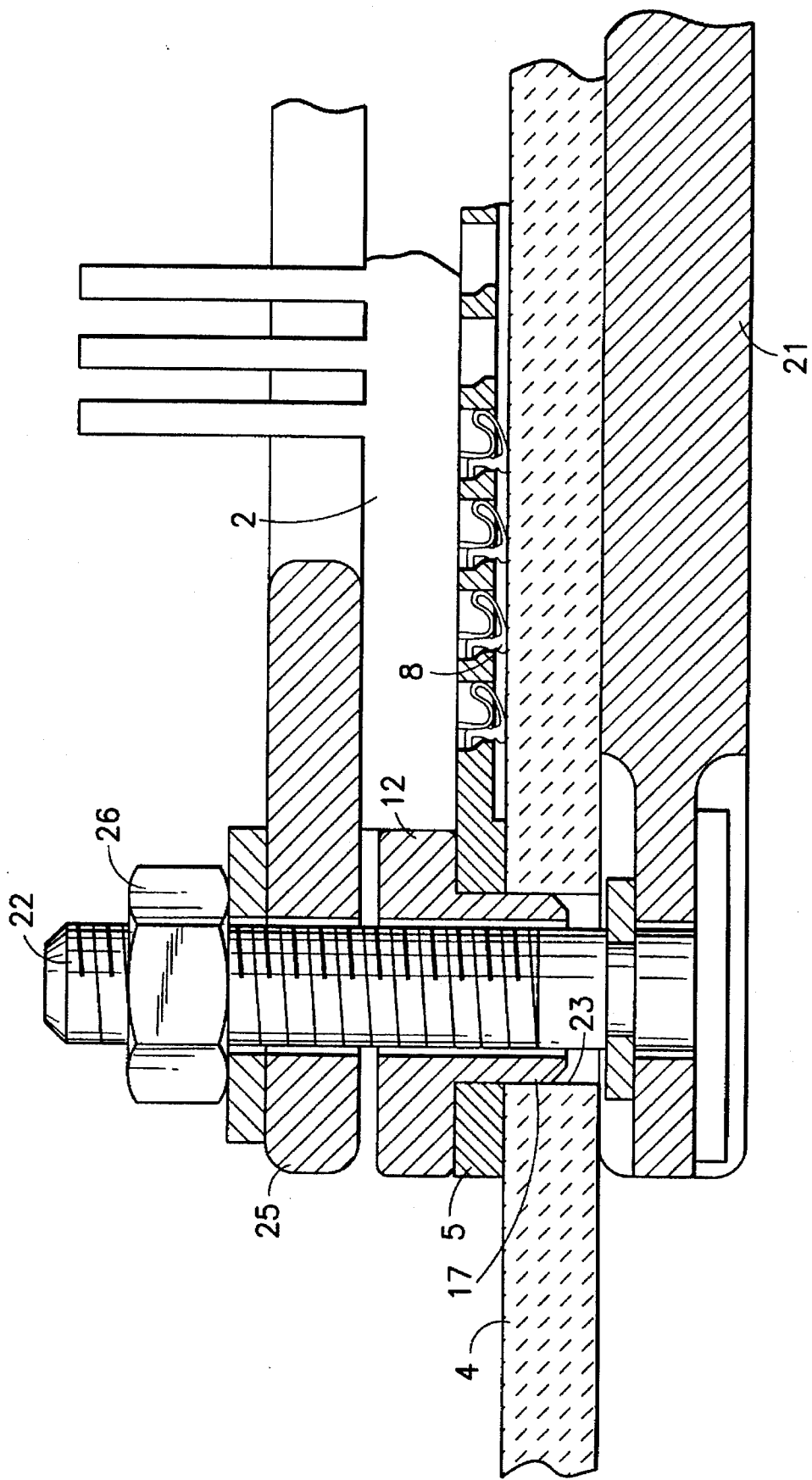
FIG. 2 partly shows a cross-section of the connector of FIG. 1 in assembled position.

FIG. 2 shows the connector 1 in assembled position together with the corresponding mounting means. These mounting means comprises a mounting plate 21 with four mounting bolts 22. The mounting bolts 22 project through openings 23 of the printed circuit board 4 and through the hollow pins 17 of the reference sections 12 and the support 14, respectively, and finally through openings 24 of a mounting frame 25. The complete assembly is attached by means of nuts 26. Therefore no separate openings need to be provided for mounting the reference sections 12 at the support 14.

FIG. 2 further shows that the pin 17 of the reference section 12 projects through the housing 5 and is fittingly received in an opening 23 in the printed circuit board 4. These openings 23 are accurately located with respect to the contact pads 3 of the printed circuit board 4. In this manner the pin 17 of each reference section 12 also provides for positioning the housing 5 with respect to the contact pads 3 of the printed circuit board 4.

The connector 1 described shows the advantage that the housing 5 is suitable for substrates of different sizes. By a simple adaptation of the size of the reference sections 12 a larger or smaller part of the zone 6 can be used. Of course it is in this case possible to mount contact members 8 only in the holes 7 of the housing which will be actually used.

FIG. 4 shows an alternative embodiment of the connector described wherein the reference element 11 is made as a unit and also supports the spring elements 13. Actually the reference element 11 consists in this case of one L-shaped section the legs of which extend along the full adjacent side of the zone 6 of the housing 5. At the free ends of the legs of the reference element 11 extensions 27 are provided supporting the spring elements 13. In this case the reference edges 15, 16 each are determined by two projections 28.

FIGS. 5A, 5B show a third embodiment which mainly corresponds with the embodiment of the connector of FIGS. 4A, 4B, wherein a reference element 30 is used partially overlapping the zone 6 so that the reference edges 15, 16 are closer to the centre of the housing 5. Thereby a substantially smaller part of the zone 6 is free to receive a substrate 2 of smaller size.

In the embodiments of FIGS. 4 and 5 the reference element 11 and 30, respectively is provided with two hollow pins 17 and with an opening 29 for passage of a mounting bolt 22.

The invention is not restricted to the above-described embodiments which can be varied within a number of ways within the scope of the invention.

I claim:

1. Connector for connecting a substrate with an electronic circuit to a printed circuit board, said substrate having a main surface provided with contact pads or the like arranged in a given grid pattern with a predetermined pitch in column and row directions and said substrate having side edges located at a predetermined location with respect to the contact pads and said printed circuit board having contact pads arranged in said grid pattern, said connector comprising a housing of insulating material with a zone for receiving said substrate, wherein through-holes are provided in said zone in said grid pattern and contact members are provided in at least a part of said through-holes, and positioning means for locating the substrate with respect to the housing in such a manner that the through-holes of the housing are aligned with the contact pads of the substrate, wherein said positioning means comprises a reference element which can be positioned on the housing, said reference element having two reference edges adapted to cooperate with two side edges of the substrate, and a spring means adapted to press the substrate with said side edges against the reference edges, wherein the reference element and the housing are provided with cooperating coupling means for accurately positioning the reference element with respect to the housing.

2. Connector according to claim 1, wherein the coupling means of each reference element also provide a positioning of the housing with respect to the contact pads of the printed circuit board.

3. Connector according to claim 1, wherein the reference element is provided with at least one pin at its lower side and the housing has at least one through-hole, in which the pin can be fittingly received, said pin and opening being located at an accurately predetermined location with respect to the corresponding reference edges and contact members, respectively.

4. Connector according to claim 2, wherein the pin of each reference element projects through the opening of the housing and can be fittingly received in an opening of the printed circuit board, which is located at an accurately predetermined location with respect to the contact pads of the printed circuit board.

5. Connector according to claim 2, wherein the pin of the reference element is hollow for receiving a mounting bolt.

6. Connector according to claim 2, wherein the reference element comprises a projection at its lower side cooperating with a corresponding opening in said housing.

7. Connector according to claim 1, wherein the reference element comprises at least one L-shaped reference section, wherein the side edges of the legs of the reference section directed towards said zone of the housing form the reference edges.

8. Connector according to claim 7, wherein the spring means comprises a support which can be fixed on the housing opposite of said reference section diagonally with respect to said zone of the housing, said support carrying two spring elements which can each engage a side edge of the substrate.

9. Connector according to claim 8, wherein the support of the spring means has substantially the same shape as the diagonally opposite reference section.

10. Connector according to claim 7, wherein the legs of the reference section extend beyond the zone of the housing and each have a lateral extension at their free end supporting a spring element which can engage a side edge of the substrate.

11. Connector according to claim 7, wherein the reference section overlaps a part of said zone of the housing.

12. Connector according to claim 7, wherein each reference edge is determined by at least two projections formed on the corresponding leg of the reference section.

* * * * *